US012674835B2

(12) United States Patent
Liu et al.

(10) Patent No.: US 12,674,835 B2
(45) Date of Patent: *Jul. 7, 2026

(54) METHOD OF ANALYZING SEMICONDUCTOR STRUCTURE

(71) Applicant: TAIWAN SEMICONDUCTOR MANUFACTURING COMPANY LTD., Hsinchu (TW)

(72) Inventors: Yi Min Liu, Hsinchu (TW); Chien-Yi Chen, Hsinchu (TW); Yian-Liang Kuo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,694

(22) Filed: Feb. 21, 2024

(65) Prior Publication Data

US 2024/0192262 A1 Jun. 13, 2024

Related U.S. Application Data

(63) Continuation of application No. 17/178,193, filed on Feb. 17, 2021, now Pat. No. 11,959,958, which is a continuation of application No. 16/263,869, filed on Jan. 31, 2019, now Pat. No. 10,955,459.

(60) Provisional application No. 62/690,594, filed on Jun. 27, 2018.

(51) Int. Cl.
*G01R 31/265* (2006.01)
*G01R 31/28* (2006.01)

*H01L 21/67* (2006.01)
*H01L 21/687* (2006.01)
*H10P 72/00* (2026.01)
*H10P 72/76* (2026.01)

(52) U.S. Cl.
CPC ..... *G01R 31/2656* (2013.01); *G01R 31/2874* (2013.01); *H10P 72/0602* (2026.01); *H10P 72/0606* (2026.01); *H10P 72/0616* (2026.01); *H10P 72/7618* (2026.01)

(58) Field of Classification Search
CPC ........... G01R 31/2656; G01R 31/2874; G01R 31/275; G01R 31/2601; G01R 31/2843; H01L 21/67248; H01L 21/67259; H01L 21/67288; H01L 21/68764
See application file for complete search history.

(56) References Cited

U.S. PATENT DOCUMENTS

| | | | | |
|---|---|---|---|---|
| 4,453,080 A | * | 6/1984 | Berkowitz | .......... H01L 21/6835 250/442.11 |
| 7,453,150 B1 | * | 11/2008 | McDonald | ........ H01L 21/76898 438/455 |
| 2003/0085730 A1 | * | 5/2003 | Borden | .............. G01N 21/1717 257/E21.53 |

(Continued)

*Primary Examiner* — Thang X Le
*Assistant Examiner* — Haidong Zhang
(74) *Attorney, Agent, or Firm* — WPAT LAW; Anthony King

(57) ABSTRACT

A method includes providing a detector disposed above a semiconductor structure; identifying a portion of the semiconductor structure at a temperature substantially greater than a predetermined threshold by the detector, rotating the stage; and deriving a position of the portion of the semiconductor structure based upon the rotation of the stage.

20 Claims, 19 Drawing Sheets

(56) References Cited

U.S. PATENT DOCUMENTS

| 2004/0016896 A1* | 1/2004 | Almogy | G01N 21/956 |
| | | | 250/559.45 |
| 2009/0042365 A1* | 2/2009 | McDonald | H01L 25/50 |
| | | | 438/459 |
| 2010/0265494 A1* | 10/2010 | Oshima | G01N 21/9501 |
| | | | 356/51 |
| 2013/0171744 A1* | 7/2013 | Kang | H01L 22/10 |
| | | | 438/795 |

* cited by examiner

103

101

101

METHOD OF ANALYZING SEMICONDUCTOR STRUCTURE

PRIORITY CLAIM AND CROSS-REFERENCE

This application claims the benefit of provisional application Ser. No. 62/690,594 filed on Jun. 27, 2018, entitled "METHOD OF ANALYZING A SEMICONDUCTOR STRUCTURE", non-provisional application Ser. No. 16/263,869 filed on Jan. 31, 2019, entitled "METHOD OF ANALYZING SEMICONDUCTOR STRUCTURE", and non-provisional application Ser. No. 17/178,193 filed on Feb. 17, 2021, entitled "METHOD OF ANALYZING SEMICONDUCTOR STRUCTURE," the disclosure of which is hereby incorporated by reference in its entirety.

BACKGROUND

With the advancement of electronic technology, the semiconductor device is becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

After the manufacturing of the semiconductor device, inspections of the semiconductor device are performed before delivery. The semiconductor device has to undergo failure analysis to find out defects and causes, so as to improve manufacturing and reliability of the semiconductor device. However, the semiconductor device in a miniaturized scale becomes more complicated. As such, the failure analysis of the semiconductor device may encounter challenges. For example, it may be difficult to determine a failure position accurately.

As such, there is a continuous need to modify and improve testing and analysis of the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
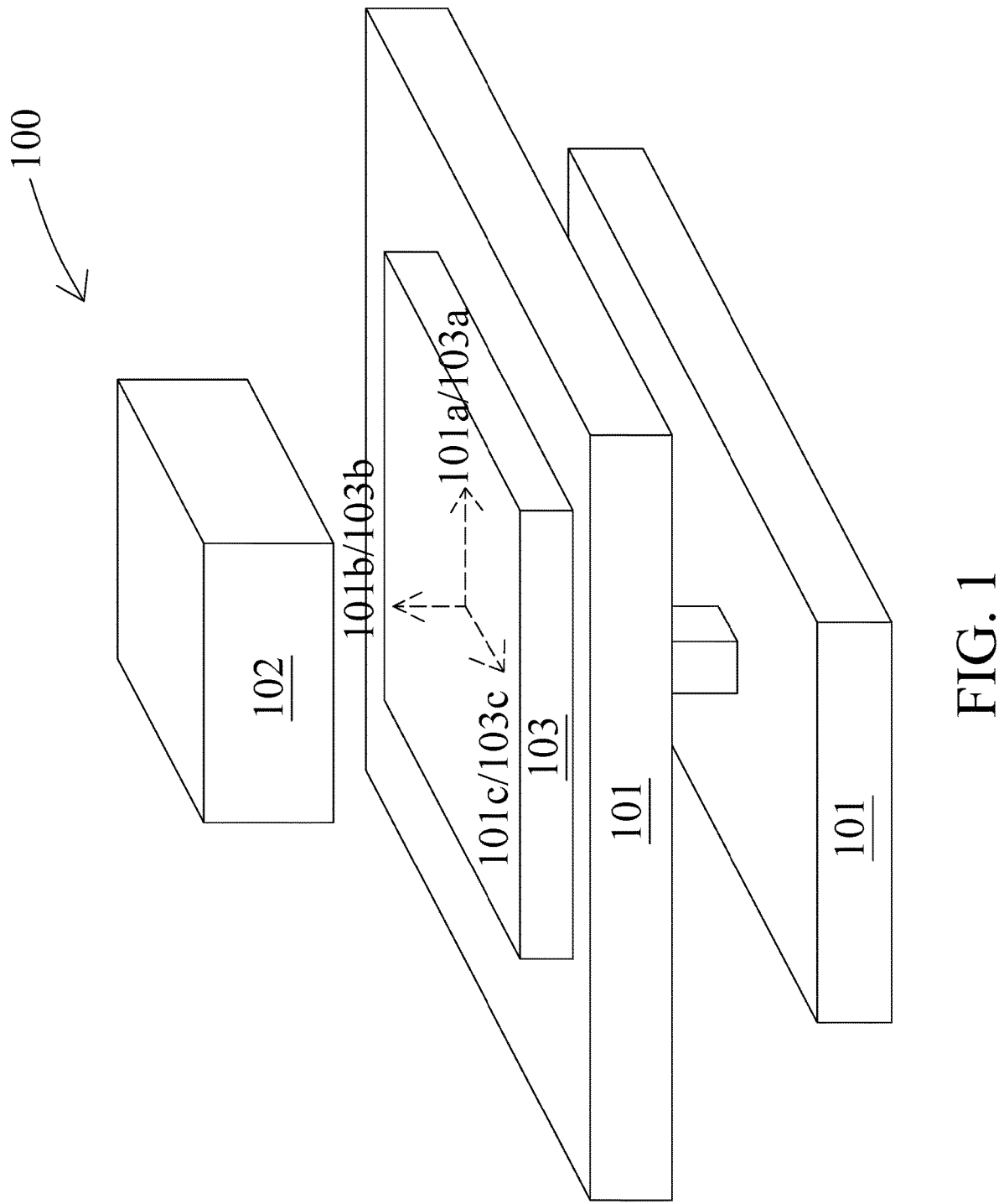
FIG. 1 is a schematic isometric view of an apparatus for analyzing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. After the manufacturing, testing and inspection of the semiconductor structure are performed. The semiconductor structure may undergo failure analysis to find out defects and causes of defects. Thermal analysis of the semiconductor structure is performed to locate abnormal portion (such as bridging, poor electrical connection, etc.) of circuitry in the semiconductor structure by detection of infrared (IR) radiation. A thermal detector is used to identify and locate the abnormal portion of the semiconductor structure. The abnormal portion shall emit a higher level of IR (heat) compared with normal portion of the semiconductor structure. However, an exact position of the abnormal portion may not be derivable by the thermal detector. Since the semiconductor structure may include several dies or packages stacking over each other and the abnormal portion may be located between dies or packages, the thermal detector may not be able to identify or accurately locate the abnormal portion.

In the present disclosure, a method of analyzing a semiconductor structure is disclosed. The method includes providing a semiconductor structure, a stage and a detector, loading the semiconductor structure on the stage, applying a voltage to the semiconductor structure, identifying a portion of the semiconductor structure at a temperature substantially greater than a predetermined threshold by the detector, rotating the stage relative to the detector, recording the rotation of the stage, and deriving a position of the portion of the semiconductor structure based upon the rotation of the stage. IR radiation emitted from an abnormal portion of the semiconductor structure can be detected by the detector in different directions. Therefore, a position of the abnormal portion can be located accurately.

Further, a method of analyzing a semiconductor structure is disclosed. The method includes providing a semiconductor structure, a stage and a detector, loading the semiconductor structure on the stage, applying a voltage to the semiconductor structure, identifying a portion of the semiconductor structure at a temperature substantially greater than a predetermined threshold by the detector, rotating the detector about the stage, recording a rotation of the detector, and deriving a position of the portion of the semiconductor structure based upon the rotation of the detector. IR radiation emitted from an abnormal portion of the semiconductor structure can be detected in different directions by rotation of the detector about the stage. Therefore, a position of the abnormal portion can be located accurately.

FIG. 1 is a schematic view of an apparatus 100 in accordance with various embodiments of the present disclosure. In some embodiments, the apparatus 100 includes a stage 101, a detector 102 and a semiconductor structure 103. In some embodiments, the apparatus 100 is configured to analyze the semiconductor structure 103. In some embodiments, the apparatus 100 is configured to perform thermal analysis of the semiconductor structure 103.

In some embodiments, the stage 101 is configured to hold the semiconductor structure 103. In some embodiments, the semiconductor structure 103 is attached to the stage 101. In some embodiments, the stage 101 is rotatable. In some embodiments, the stage 101 is rotatable relative to the detector 102. In some embodiments, the stage 101 can be rotated about a first axis 101a, a second axis 101b substantially orthogonal to the first axis 101a and a third axis 101c substantially orthogonal to the first axis 101a and the second axis 101b. In some embodiments, the stage 101 has three rotational degrees of freedom. In some embodiments, the stage 101 includes a ball joint configured to rotate the stage 101 about the first axis 101a, the second axis 101b or the third axis 101c.

In some embodiments, the detector 102 is configured to detect IR radiation emitted from the semiconductor structure 103 on the stage 101. In some embodiments, the detector 102 is a thermal detector. In some embodiments, the detector 102 is configured to identify a portion or a spot of the semiconductor structure 103 at a temperature substantially greater than a predetermined threshold. In some embodiments, the detector 102 is configured to identify an abnormal portion of a circuitry of the semiconductor structure 103. In some embodiments, the abnormal portion of the circuitry of the semiconductor structure 103 emits a higher level of IR radiation compared with a normal portion of the circuitry of the semiconductor structure 103. In some embodiments, the detector 102 is stationary. In some embodiments, the detector 102 is linearly movable. In some embodiments, the detector 102 is not rotatable.

In some embodiments, the semiconductor structure 103 is disposed on the stage 101. In some embodiments, the semiconductor structure 103 is attached to the stage 101, such that displacement of the stage 101 is substantially consistent with displacement of the semiconductor structure 103. In some embodiments, the semiconductor structure 103 is rotatable relative to the detector 102. In some embodiments, the semiconductor structure 103 can be rotated about a fourth axis 103a substantially parallel to the first axis 101a, a fifth axis 103b substantially parallel to the second axis 101b, or a sixth axis 103c substantially parallel to the third axis 101c.

In some embodiments, the semiconductor structure 103 is a wafer, a die or a package. In some embodiments, the semiconductor structure 103 includes several dies or packages disposed coplanar with or stacking over each other. In some embodiments, the semiconductor structure 103 includes a circuitry. In some embodiments, the semiconductor structure 103 includes electrical components and conductive lines connecting the electrical components. In some embodiments, the circuitry of the semiconductor structure 103 is operable by applying a voltage.

Figure 2:
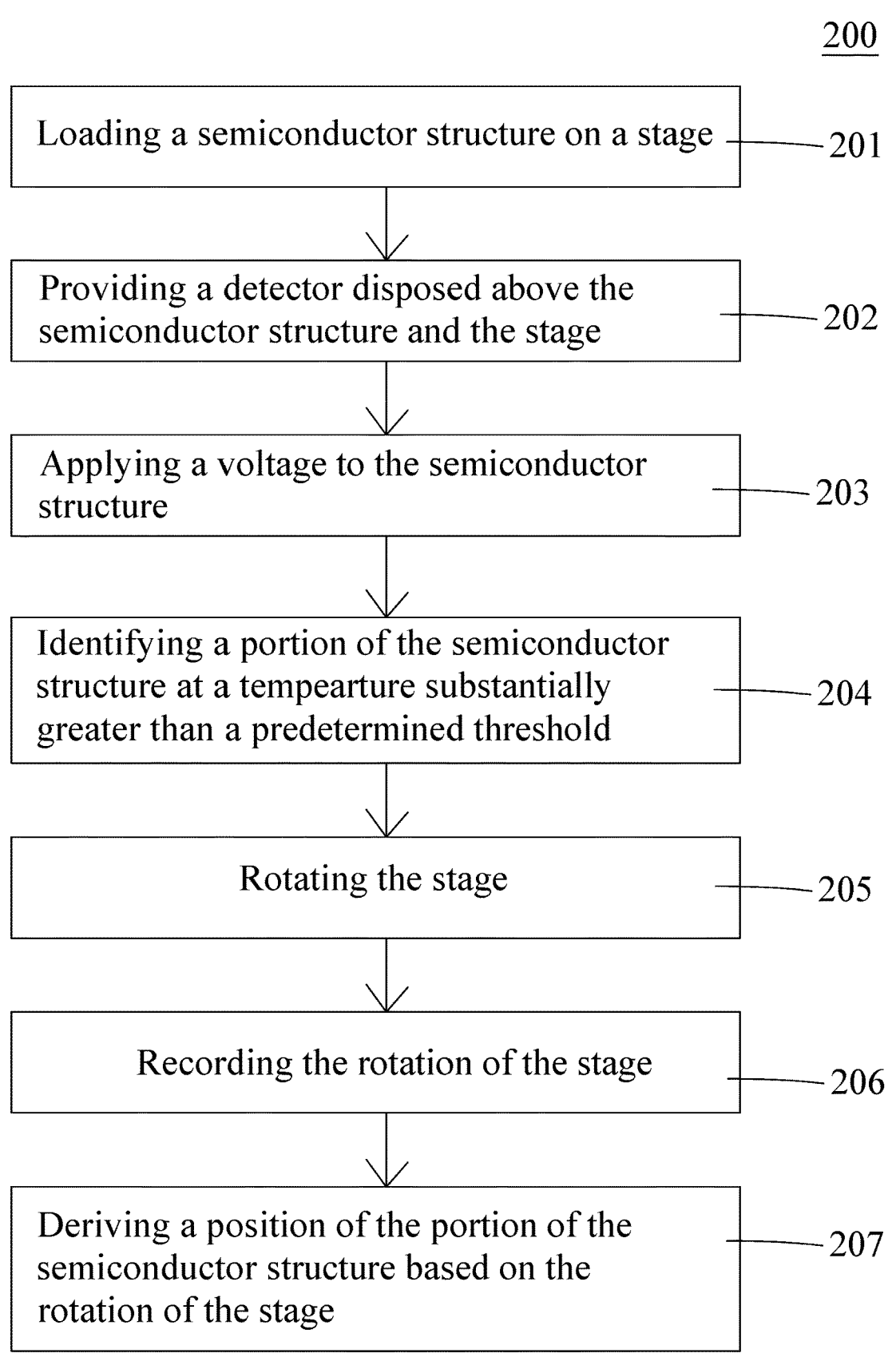
FIG. 2 is a flow diagram of a method of analyzing a semiconductor structure in accordance with some embodiments of the present disclosure.

In the present disclosure, a method of analyzing a semiconductor structure is also disclosed. In some embodiments, a semiconductor structure is analyzed by a method 200. The method 200 includes a number of operations and the description and illustration are not deemed as a limitation as the sequence of the operations. FIG. 2 is an embodiment of the method 200 of analyzing a semiconductor structure. The method 200 includes a number of operations (201, 202, 203, 204, 205, 206 and 207). In some embodiments, the method 200 is performed by the apparatus 100 described above or shown in FIG. 1.

Figure 3:
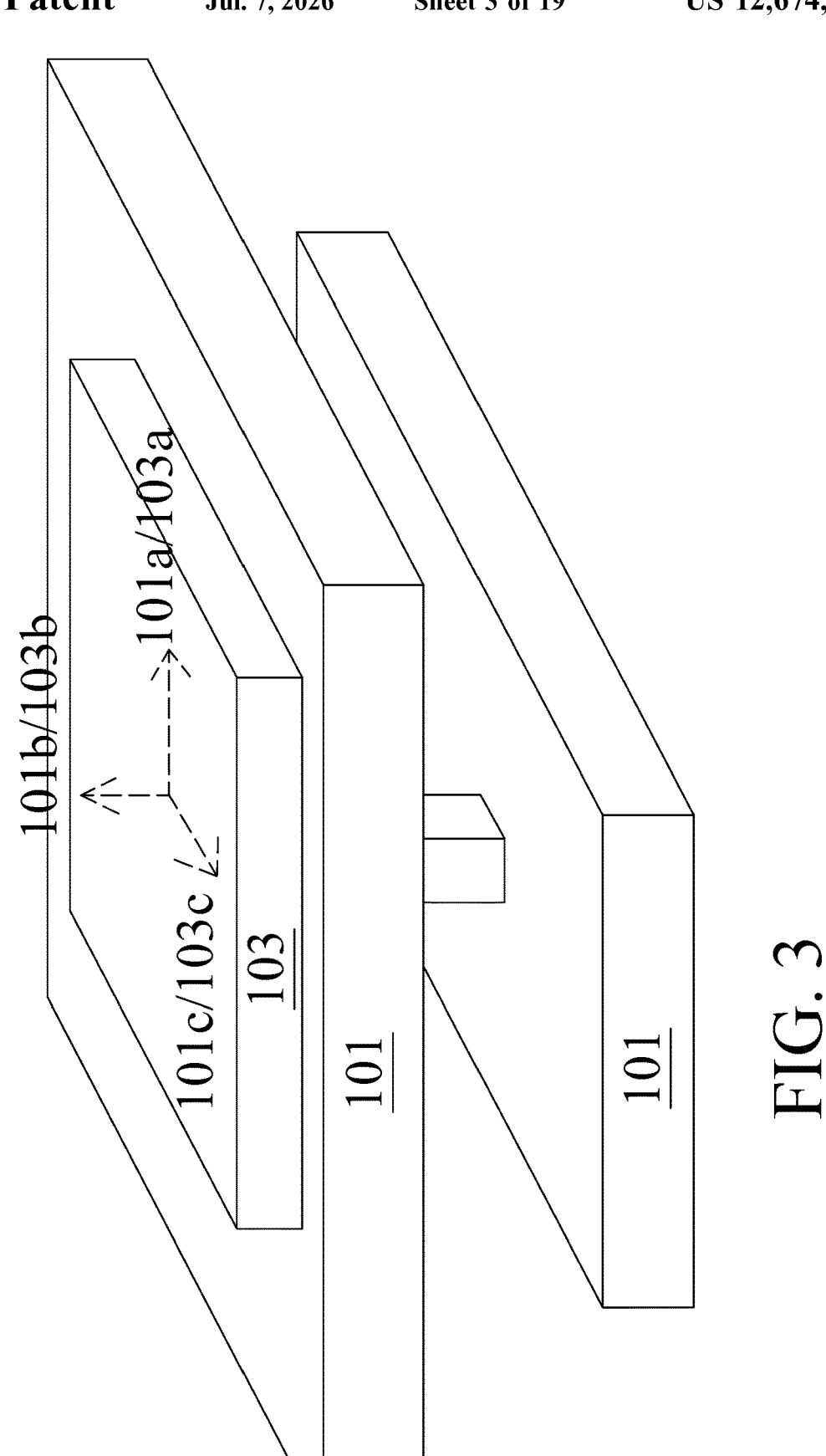
FIGS. 3-7 are schematic isometric views of analyzing a semiconductor structure by a method of FIG. 2 in accordance with some embodiments of the present disclosure.

In operation 201, a semiconductor structure 103 is loaded on a stage 101 as shown in FIG. 3. In some embodiments, the semiconductor structure 103 is attached to the stage 101. In some embodiments, the semiconductor structure 103 includes several dies or packages disposed coplanar with or stacking over each other.

In some embodiments, the stage 101 is rotatable. In some embodiments, the stage 101 is defined with a first axis 101a, a second axis 101b substantially orthogonal to the first axis 101a and a third axis 101c substantially orthogonal to the first axis 101a and the second axis 101b. In some embodiments, the stage 101 can be rotated about at least one of the first axis 101a, the second axis 101b and the third axis 101c.

In some embodiments, the semiconductor structure 103 is also defined with a fourth axis 103a substantially parallel to the first axis 101a, a fifth axis 103b substantially parallel to the second axis 101b and a sixth axis 103c substantially parallel to the third axis 101c. In some embodiments, the semiconductor structure 103 is rotatable about the fourth axis 103a, the fifth axis 103b and the sixth axis 103c. In some embodiments, the stage 101 and the semiconductor structure 103 have similar configurations as those described above or shown in FIG. 1.

Figure 4:
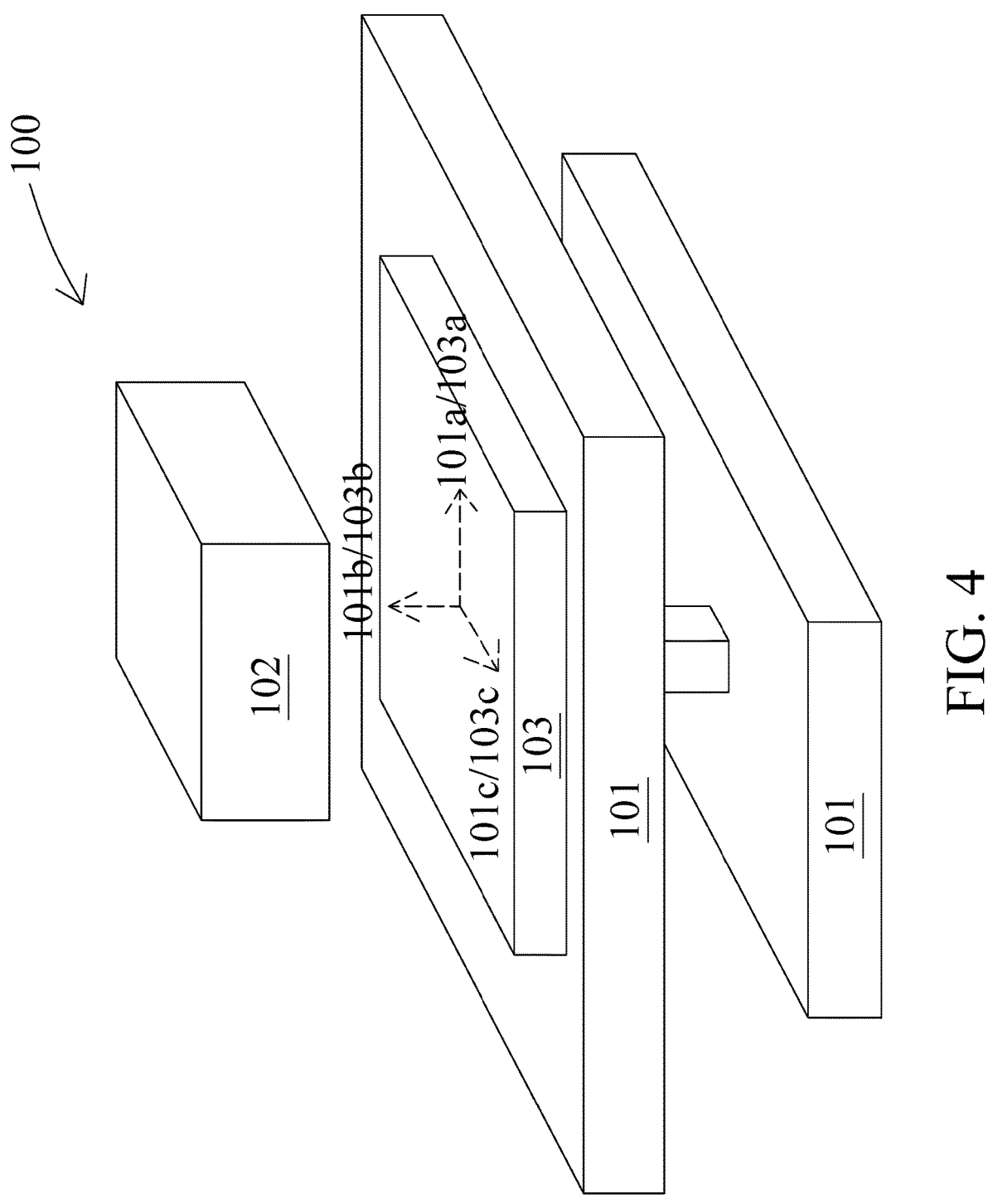

In operation 202, a detector 102 is provided as shown in FIG. 4. In some embodiments, the detector 102 is disposed above the stage 101 and the semiconductor structure 103. In some embodiments, the detector 102 is configured to detect IR radiation emitted from the semiconductor structure 103 on the stage 101. In some embodiments, the detector 102 is a thermal detector. In some embodiments, the detector 102 is configured to identify a portion or a spot of the semiconductor structure 103 at a temperature substantially greater than a predetermined threshold.

In some embodiments, the detector 102 is configured to detect a hot spot of the semiconductor structure 103, where is an abnormal portion of a circuitry of the semiconductor structure 103. In some embodiments, the detector 102 is stationary. In some embodiments, the detector 102 is linearly movable. In some embodiments, the detector 102 is not rotatable. In some embodiments, the detector 102 has similar configurations as the one described above or shown in FIG. 1. In some embodiments, the apparatus 100 has similar configurations as the one described above or shown in FIG. 1.

Figure 5:
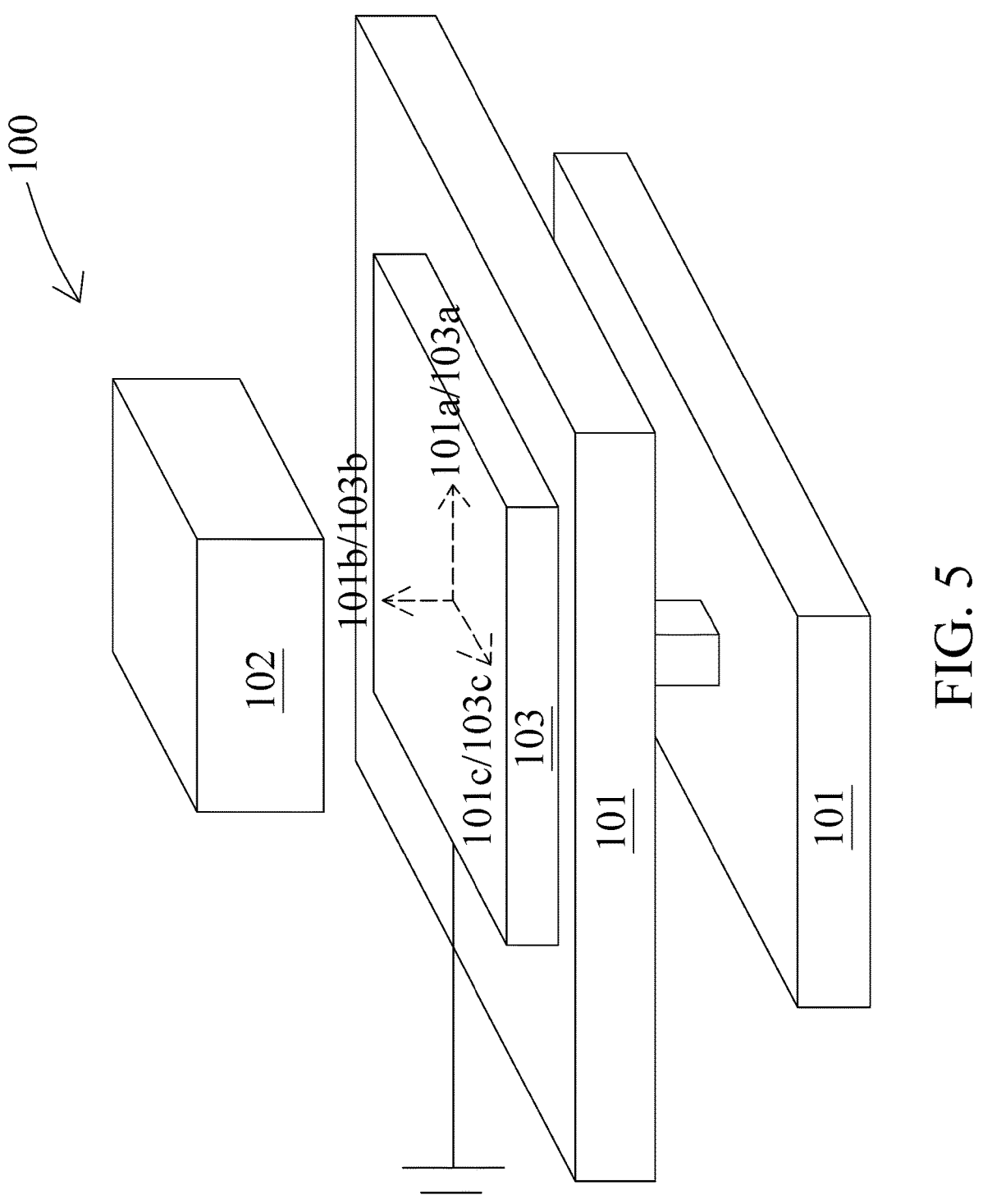

In operation 203, a voltage is applied to the semiconductor structure 103 as shown in FIG. 5. In some embodiments, a circuitry of the semiconductor structure 103 is connected to the voltage. In some embodiments, the voltage is a power source. In some embodiments, the circuitry of the semiconductor structure 103 is operated upon the application of the voltage. In some embodiments, the voltage is an operation voltage of the circuitry of the semiconductor structure 103.

Figure 6:
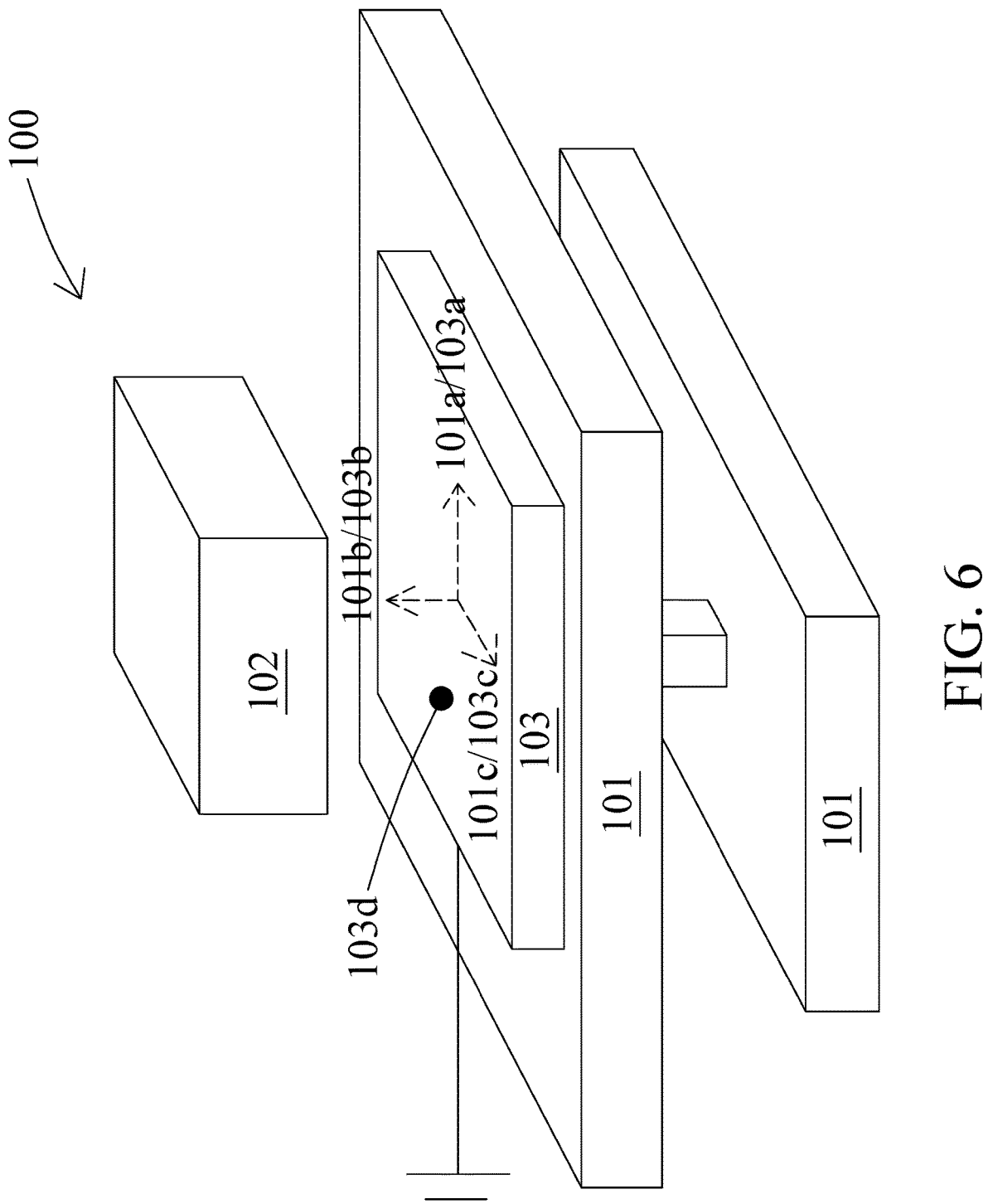

In operation 204, a portion 103d of the semiconductor structure 103 at a temperature substantially greater than a predetermined threshold is identified by the detector 102 as shown in FIG. 6. In some embodiments, the portion 103d of the semiconductor structure 103 is identified by detecting IR radiation emitted from the semiconductor structure 103 by the detector 102.

In some embodiments, the detector 102 can identify the portion 103d of the semiconductor structure 103 at the temperature substantially greater than the predetermined threshold. In some embodiments, the detector 102 can identify the portion 103d of the semiconductor structure 103 where emits a level of IR radiation higher than a predetermined threshold. In some embodiments, the portion 103d of the semiconductor structure 103 is an abnormal portion of a circuitry of the semiconductor structure 103. In some embodiments, the detector 102 identifies the portion 103d by receiving IR radiation from the semiconductor structure 103.

In some embodiments, the portion 103d of the semiconductor structure 103 is at a temperature substantially greater than the predetermined threshold. In some embodiments, the portion 103d of the semiconductor structure 103 emits a higher level of IR radiation compared with a normal portion of the circuitry of the semiconductor structure 103. In some embodiments, the temperature of the portion 103d of the semiconductor structure 103 is substantially greater than a temperature of the normal portion of the circuitry of the semiconductor structure 103.

In some embodiments, the portion 103d of the semiconductor structure 103 is disposed inside the semiconductor structure 103. In some embodiments, the portion 103d of the semiconductor structure 103 is disposed between stacked dies or packages of the semiconductor structure 103. In some embodiments, the portion 103d of the semiconductor structure 103 is covered by one of stacked dies or one of stacked packages of the semiconductor structure 103.

In some embodiments, a level of IR radiation emitted from the semiconductor structure 103 is recorded after the detection of IR radiation by the detector 102 or after the identification of the portion 103d of the semiconductor structure 103 by the detector 102. In some embodiments, a level of IR radiation emitted from the portion 103d of the semiconductor structure 103 is recorded after the identification of the portion 103d of the semiconductor structure 103 by the detector 102.

Figure 7:
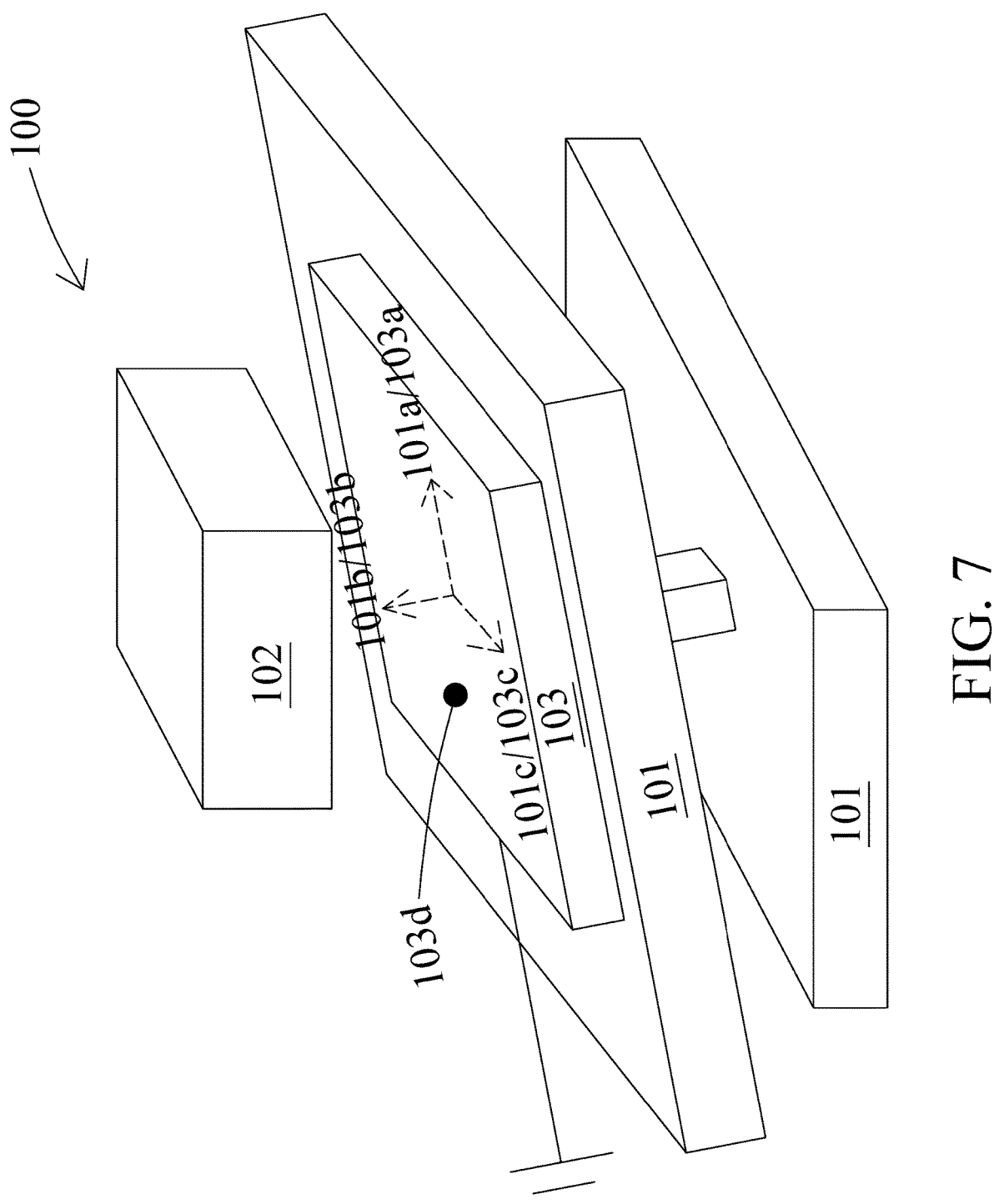

In operation 205, the stage 101 is rotated as shown in FIG. 7. In some embodiments, the stage 101 is rotated about at least one of the first axis 101a, the second axis 101b and the third axis 101c. In some embodiments, the rotation of the stage 101 includes rotating the stage 101 about at least one of the first axis 101a, the second axis 101b and the third axis 101c. In some embodiments, the stage 101 is rotated relative to the detector 102. In some embodiments, the rotation of the stage 101 is any combination of the rotation of the stage 101 about the first axis 101a, the rotation of the stage 101 about the second axis 101b and the rotation of the stage 101 about the third axis 101c.

In some embodiments, the semiconductor structure 103 is attached to the stage 101 upon the rotation of the stage 101, such that the rotation of the stage 101 is substantially consistent with a rotation of the semiconductor structure

103. In some embodiments, the semiconductor structure 103 is rotated about at least one of the fourth axis 103a, the fifth axis 103b and the sixth axis 103c. In some embodiments, the semiconductor structure 103 is rotated relative to the detector 102. In some embodiments, the portion 103d of the semiconductor structure 103 is detected by the detector 102 after the rotation of the stage 101.

In some embodiments, the detector 102 is stationary or moved linearly upon the rotation of the stage 101. In some embodiments, the portion 103d of the semiconductor structure 103 is detected by the detector 102 upon or after the rotation of the stage 101.

In operation 206, the rotation of the stage 101 is recorded. In some embodiments, the recording of the rotation of the stage 101 includes recording a first rotation of the stage 101 about the first axis 101a in a first angle, recording a second rotation of the stage 101 about the second axis 101b in a second angle, and recording a third rotation of the stage 101 about the third axis 101c in a third angle. In some embodiments, the rotation of the stage 101 is recorded after the detection of the portion 103d of the semiconductor structure 103 by the detector 102. In some embodiments, a linear movement of the detector 102 is also recorded. In some embodiments, the stage 101 is rotated (the operation 205) and the rotation of the stage 101 is recorded after the identification of the portion 103d of the semiconductor structure 103 (the operation 204).

In operation 207, a position of the portion 103d of the semiconductor structure 103 is derived based upon the rotation of the stage 101. In some embodiments, the position of the portion 103d of the semiconductor structure 103 is derived from the record of the rotation of the stage 101. For example, the stage 101 is rotated about the first axis 101a and the third axis 101c, then angles of the rotation of the stage 101 about the first axis 101a and the third axis 101c are recorded, and then the position of the portion 103d is calculated based on the record of the angles of the rotation of the stage 101 about the first axis 101a and the third axis 101c. In some embodiments, the position of the portion 103d is a three dimensional position of the portion 103d of the semiconductor structure 103. Since IR radiation emitted from the portion 103d of the semiconductor structure 103 can be detected by the detector 102 in different directions after the rotation of the stage 101, the position of the portion 103d of the semiconductor structure 103 can be located accurately. In some embodiments, the position of the portion 103d of the semiconductor structure 103 is derived from the record of the rotation of the stage 101 and the record of the linear movement of the detector 102.

Figure 8:
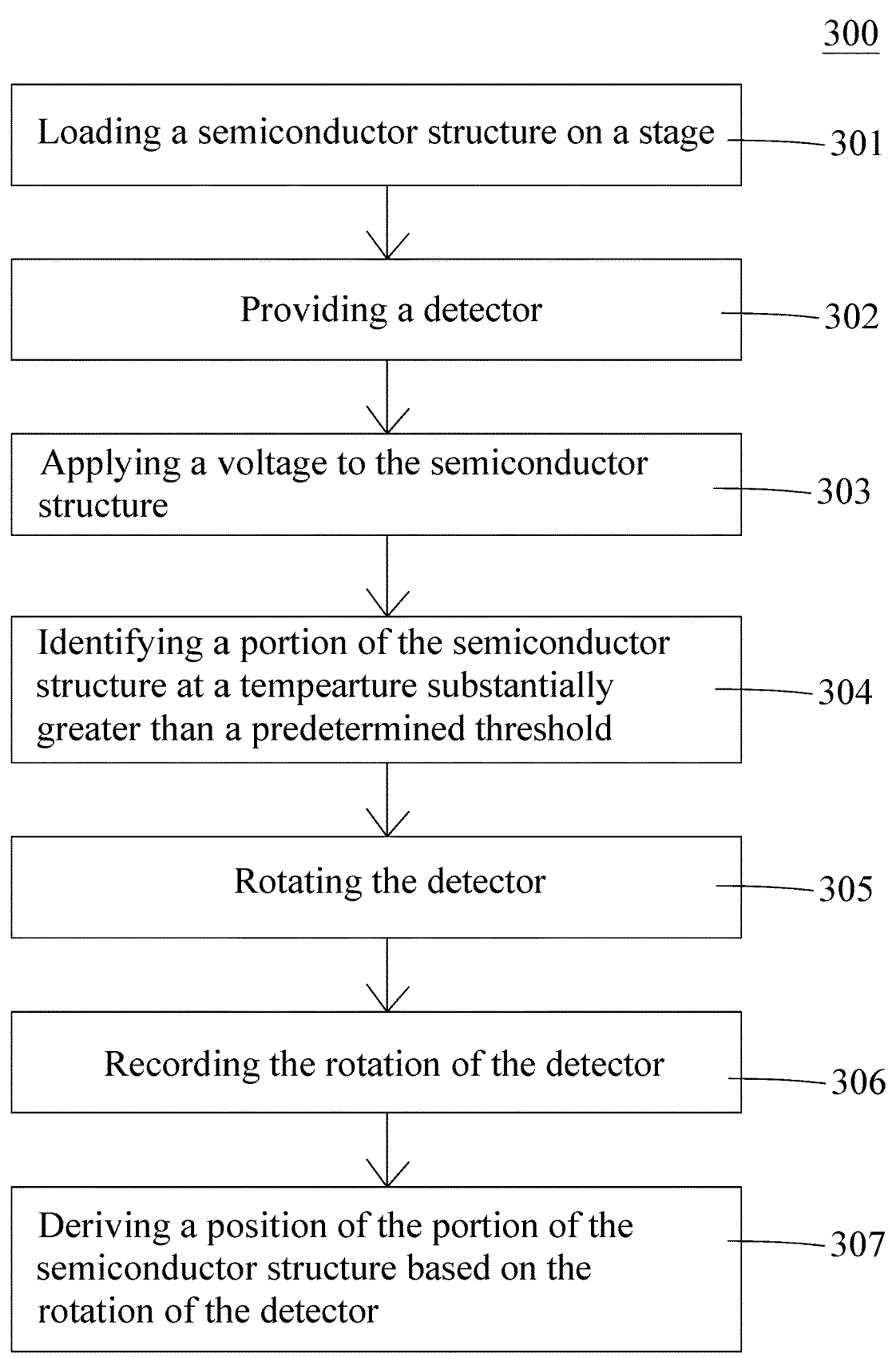
FIG. 8 is a flow diagram of a method of analyzing a semiconductor structure in accordance with some embodiments of the present disclosure.

In the present disclosure, a method of analyzing a semiconductor structure is disclosed. In some embodiments, a semiconductor structure is analyzed by a method 300. The method 300 includes a number of operations and the description and illustration are not deemed as a limitation as the sequence of the operations. FIG. 8 is an embodiment of the method 300 of analyzing a semiconductor structure. The method 300 includes a number of operations (301, 302, 303, 304, 305, 306 and 307). In some embodiments, the method 300 is performed by the apparatus 100 described above or shown in FIG. 1.

Figure 9:
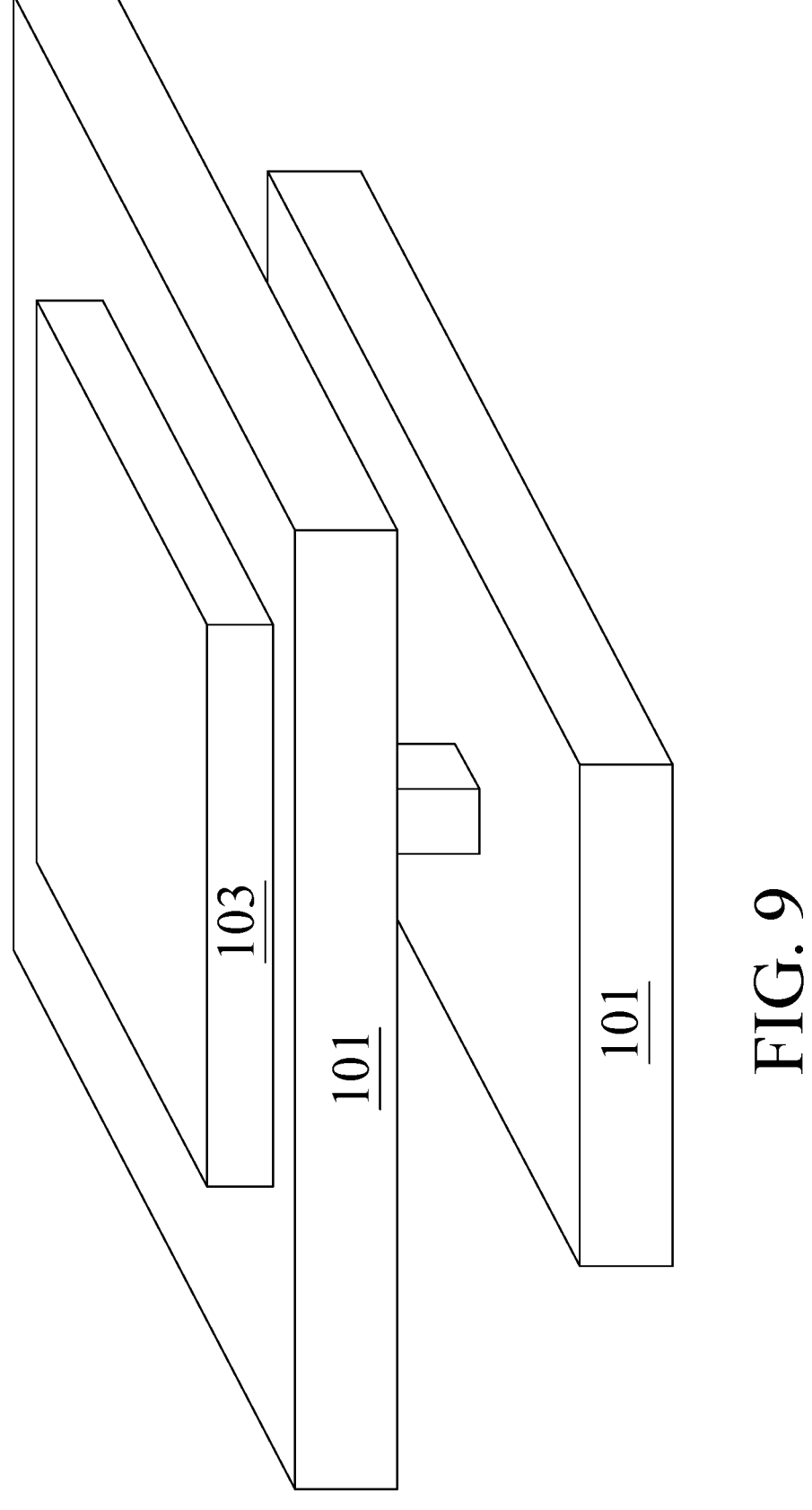
FIGS. 9-13 are schematic isometric views of analyzing a semiconductor structure by a method of FIG. 8 in accordance with some embodiments of the present disclosure.

In operation 301, a semiconductor structure 103 is loaded on a stage 101 as shown in FIG. 9. In some embodiments, the operation 301 is substantially the same as the operation 201.

Figure 10:
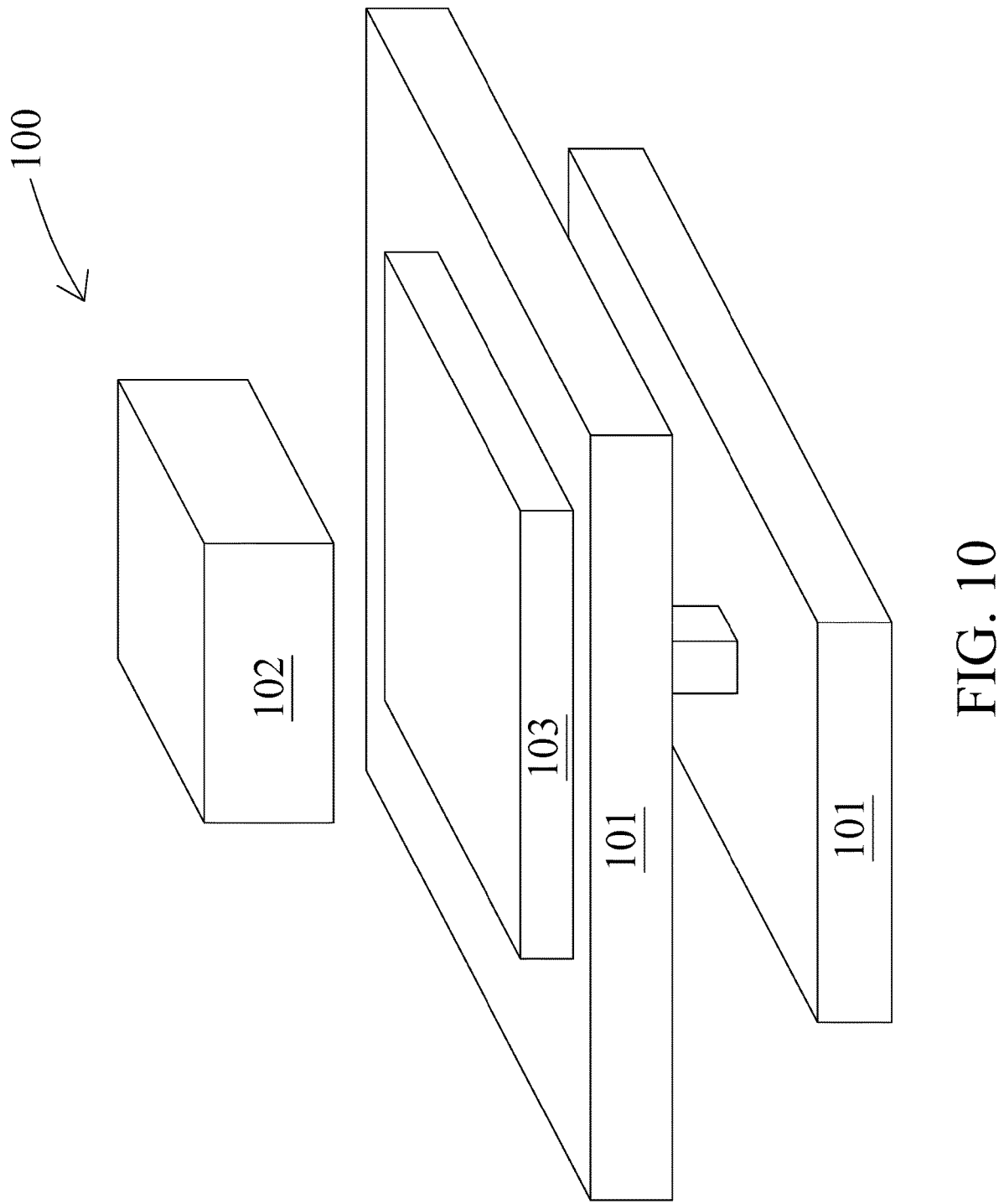

In operation 302, a detector 102 is provided as shown in FIG. 10. In some embodiments, the detector 102 has configurations as the one described above or shown in FIG. 1.

Figure 11:
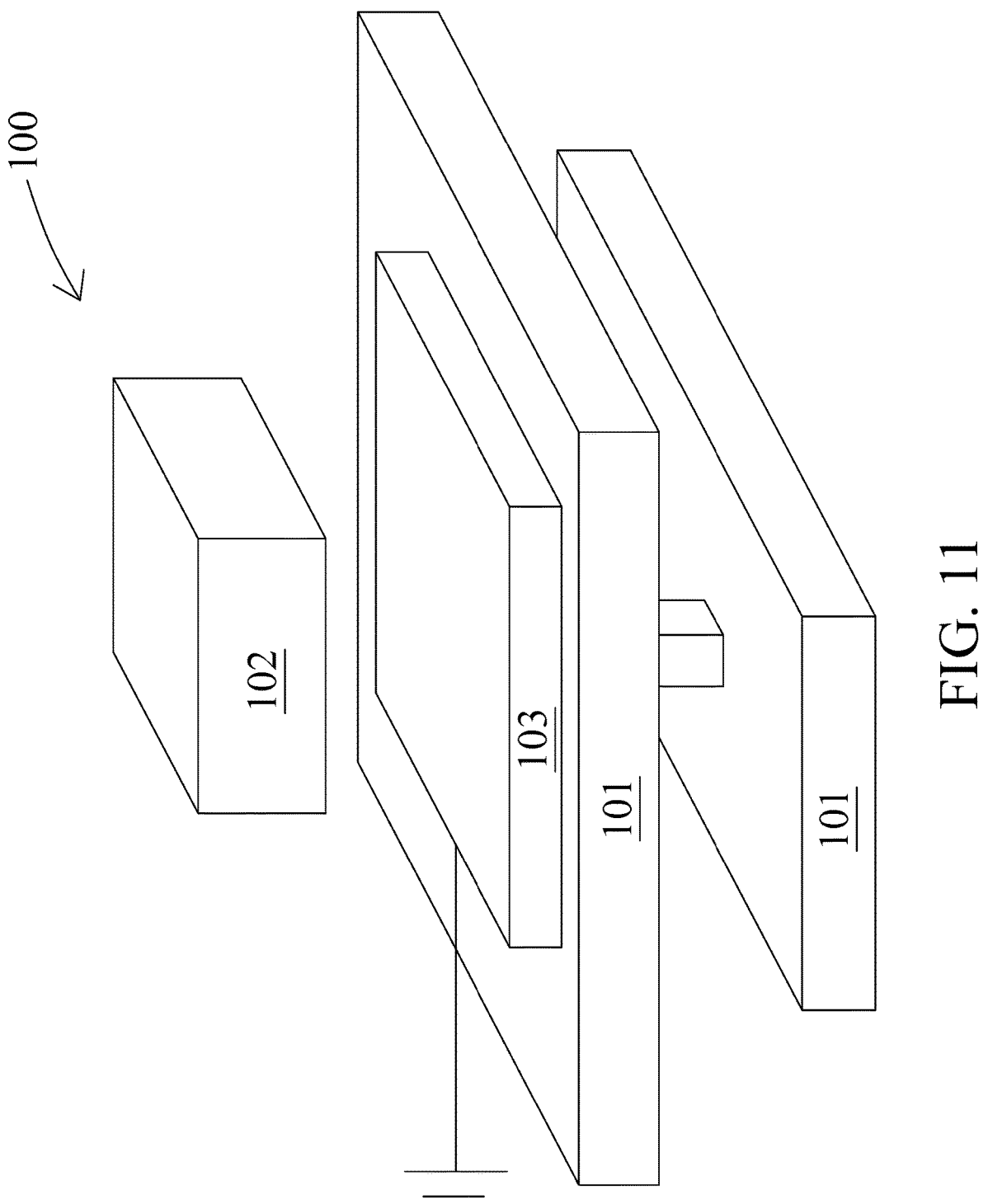

In operation 303, a voltage is applied to the semiconductor structure 103 as shown in FIG. 11. In some embodiments, the operation 303 is substantially the same as the operation 203.

Figure 12:
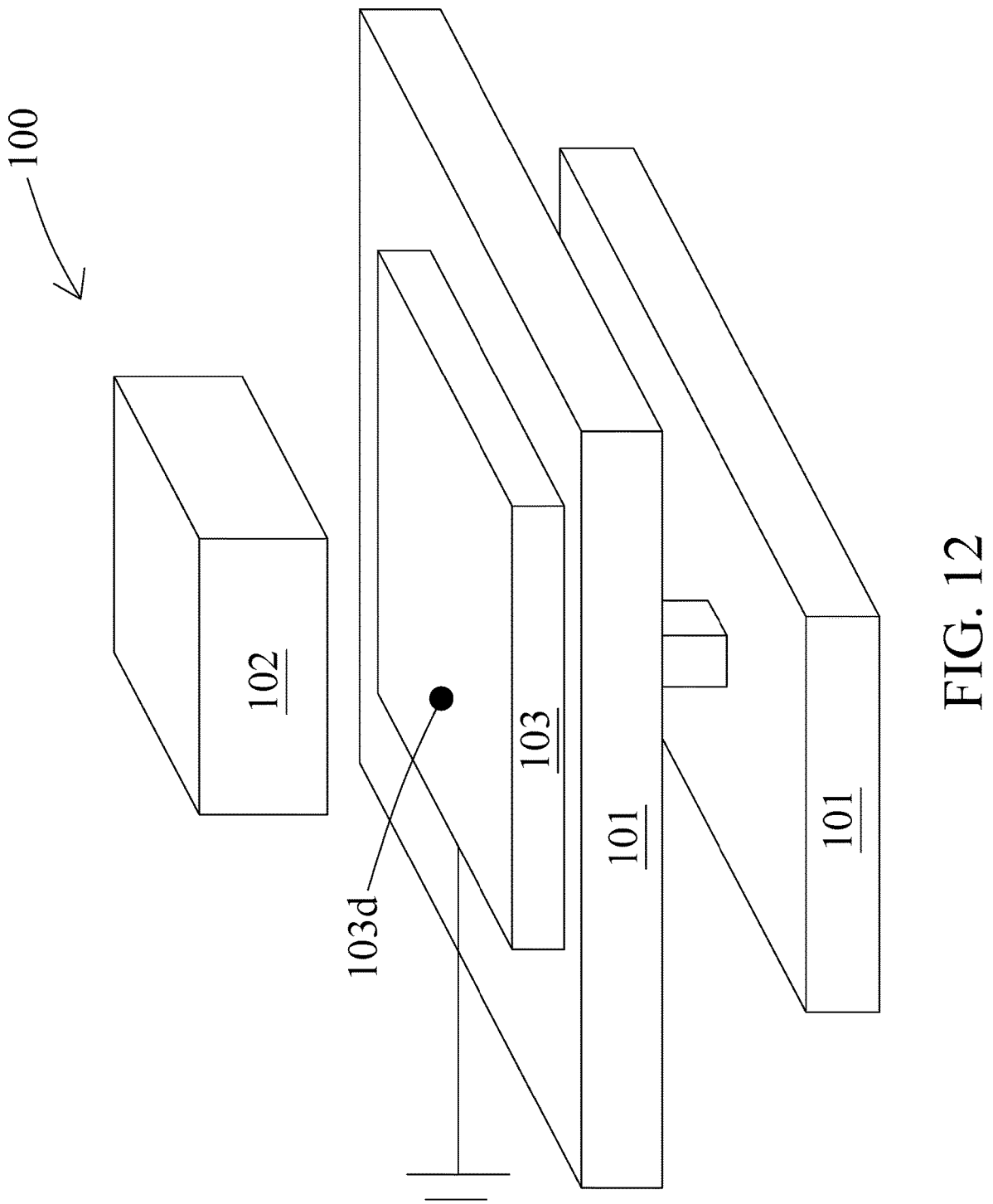

In operation 304, a portion 103*d* of the semiconductor structure 103 at a temperature substantially greater than a predetermined threshold is identified by the detector 102 as shown in FIG. 12. In some embodiments, the operation 304 is substantially the same as the operation 204.

Figure 13:
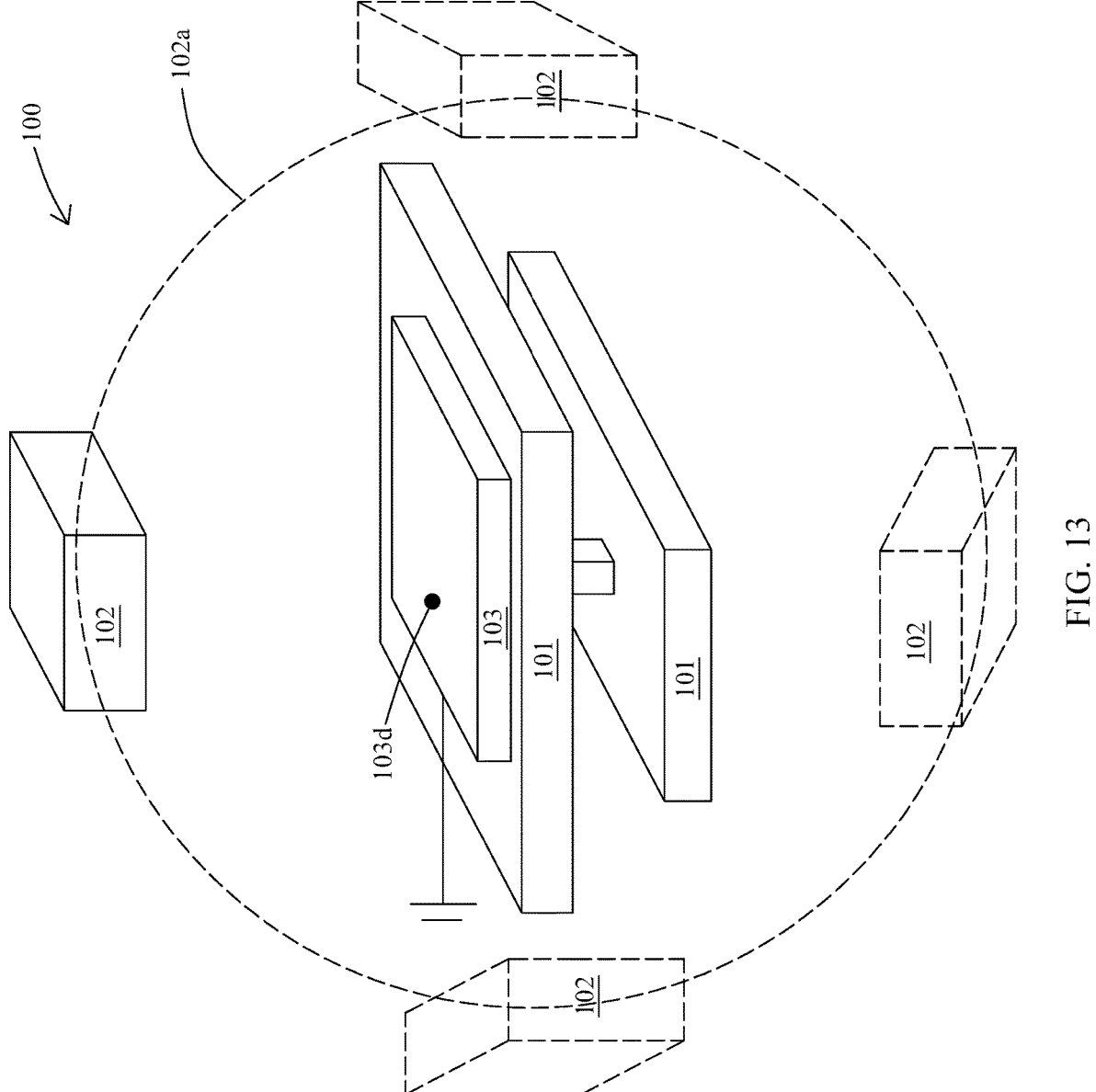

In operation 305, the detector 102 is rotated as shown in FIG. 13. In some embodiments, the detector 102 is rotated relative to the stage 101 and the semiconductor structure 103. In some embodiments, the detector 102 is rotated about the stage 101 and the semiconductor structure 103. In some embodiments, the detector 102 is rotated in a path 102*a* around the stage 101 and the semiconductor structure 103. In some embodiments, the path 102*a* is circular or elliptical path.

In some embodiments, a distance between the stage 101 and the detector 102 is substantially constant upon the rotation of the detector 102. In some embodiments, the detector 102 is disposed above or under the stage 101 and the semiconductor structure 103. In some embodiments, the detector 102 is disposed at sides of the stage 101 and the semiconductor structure 103. In some embodiments, the stage 101 is stationary. In some embodiments, the portion 103*d* of the semiconductor structure 103 is detected by the detector 102 upon or after the rotation of the detector 102.

In operation 306, the rotation of the detector 102 is recorded. In some embodiments, the recording of the rotation of the detector 102 includes recording an angle rotated by the detector about the stage 101. In some embodiments, the angle is substantially less than or equal to 360°. In some embodiments, the rotation of the detector 102 is recorded after the detection of the portion 103*d* of the semiconductor structure 103 by the detector 102.

In operation 307, a position of the portion 103*d* of the semiconductor structure 103 is derived based upon the rotation of the detector 102. For example, the detector 102 is rotated about the stage 101, then angles of the rotation of the detector 102 about the stage 101 are recorded, and then the position of the portion 103*d* is calculated based on the record of the angles of the rotation of the detector 102 about the stage 101. In some embodiments, the position of the portion 103*d* of the semiconductor structure 103 is derived from the record of the rotation of the detector 102. In some embodiments, the position of the portion 103*d* is a three dimensional position of the portion 103*d* of the semiconductor structure 103. Since IR radiation emitted from the portion 103*d* of the semiconductor structure 103 can be detected by the detector 102 in different directions after the rotation of the detector 102, the position of the portion 103*d* of the semiconductor structure 103 can be located accurately.

Figure 14:
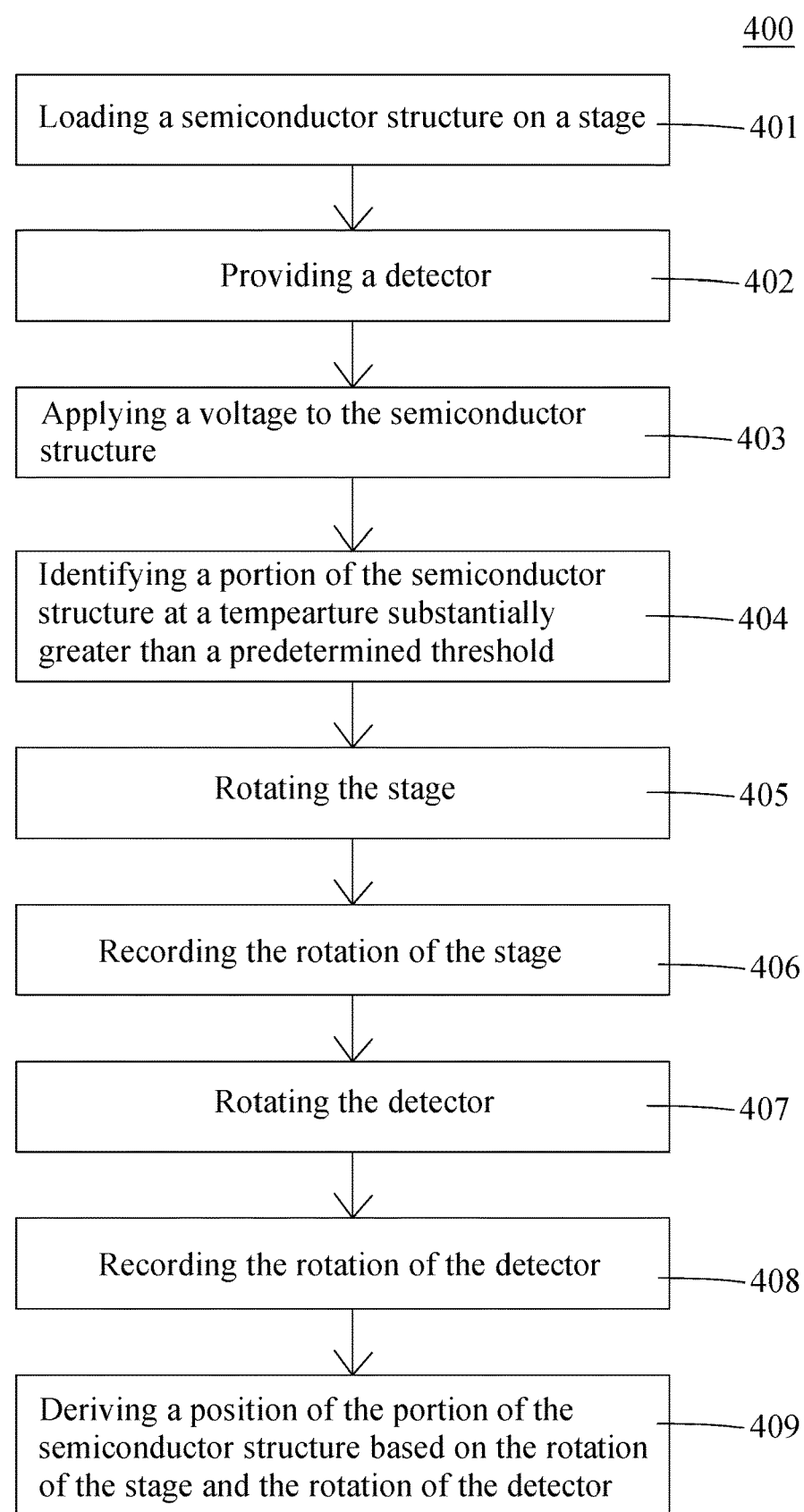
FIG. 14 is a flow diagram of a method of analyzing a semiconductor structure in accordance with some embodiments of the present disclosure.

In the present disclosure, a method of analyzing a semiconductor structure is disclosed. In some embodiments, a semiconductor structure is analyzed by a method 400. The method 400 includes a number of operations and the description and illustration are not deemed as a limitation as the sequence of the operations. FIG. 14 is an embodiment of the method 400 of analyzing a semiconductor structure. The method 400 includes a number of operations (401, 402, 403, 404, 405, 406, 407, 408 and 409). In some embodiments, the method 400 is performed by the apparatus 100 described above or shown in FIG. 1.

Figure 15:
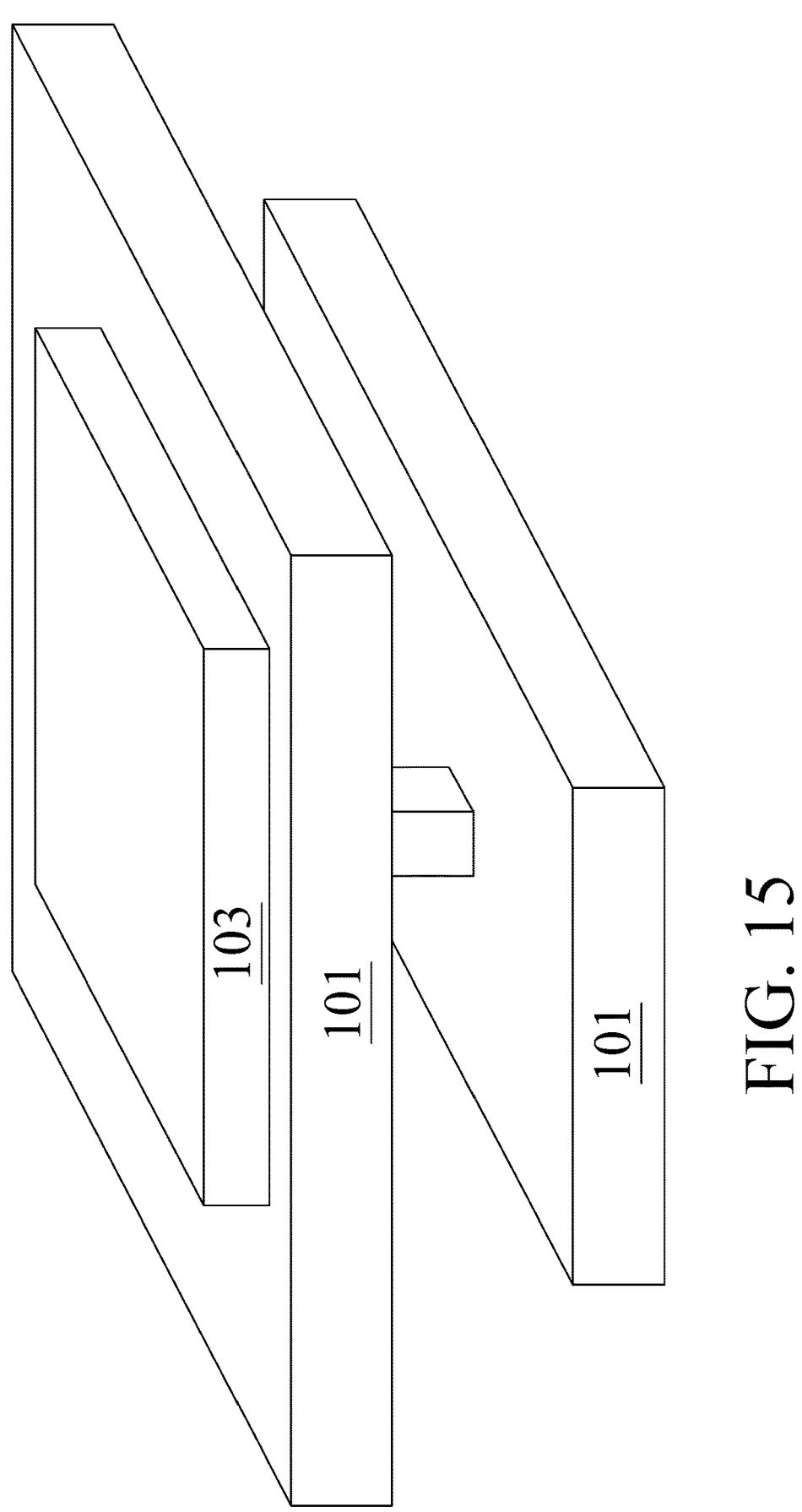
FIGS. 15-19 are schematic isometric views of analyzing a semiconductor structure by a method of FIG. 14 in accordance with some embodiments of the present disclosure.

In operation 401, a semiconductor structure 103 is loaded on a stage 101 as shown in FIG. 15. In some embodiments, the operation 401 is substantially the same as the operation 201 and 301.

Figure 16:
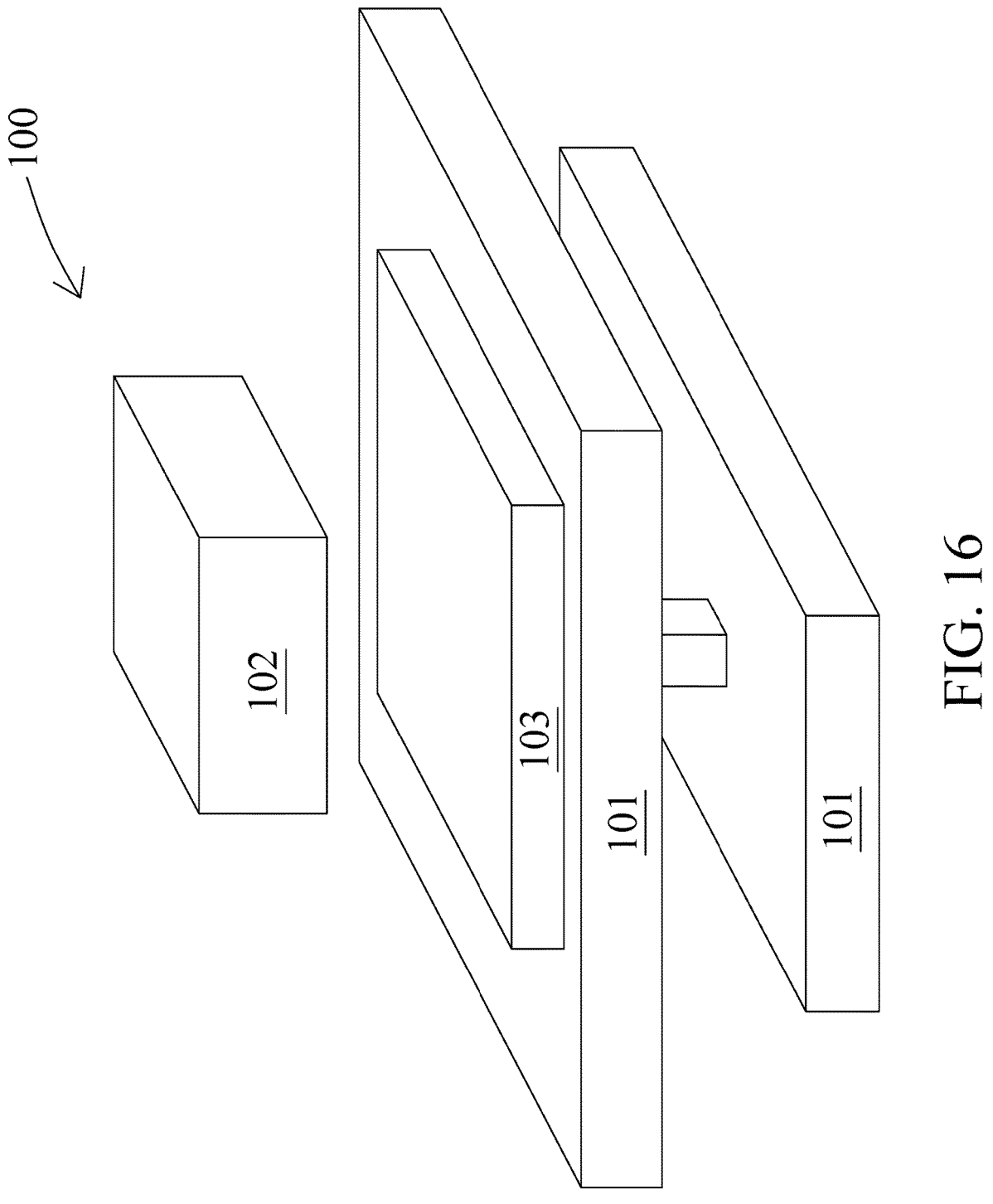

In operation 402, a detector 102 is provided as shown in FIG. 16. In some embodiments, the detector 102 has configurations as the one described above or shown in FIG. 1.

Figure 17:
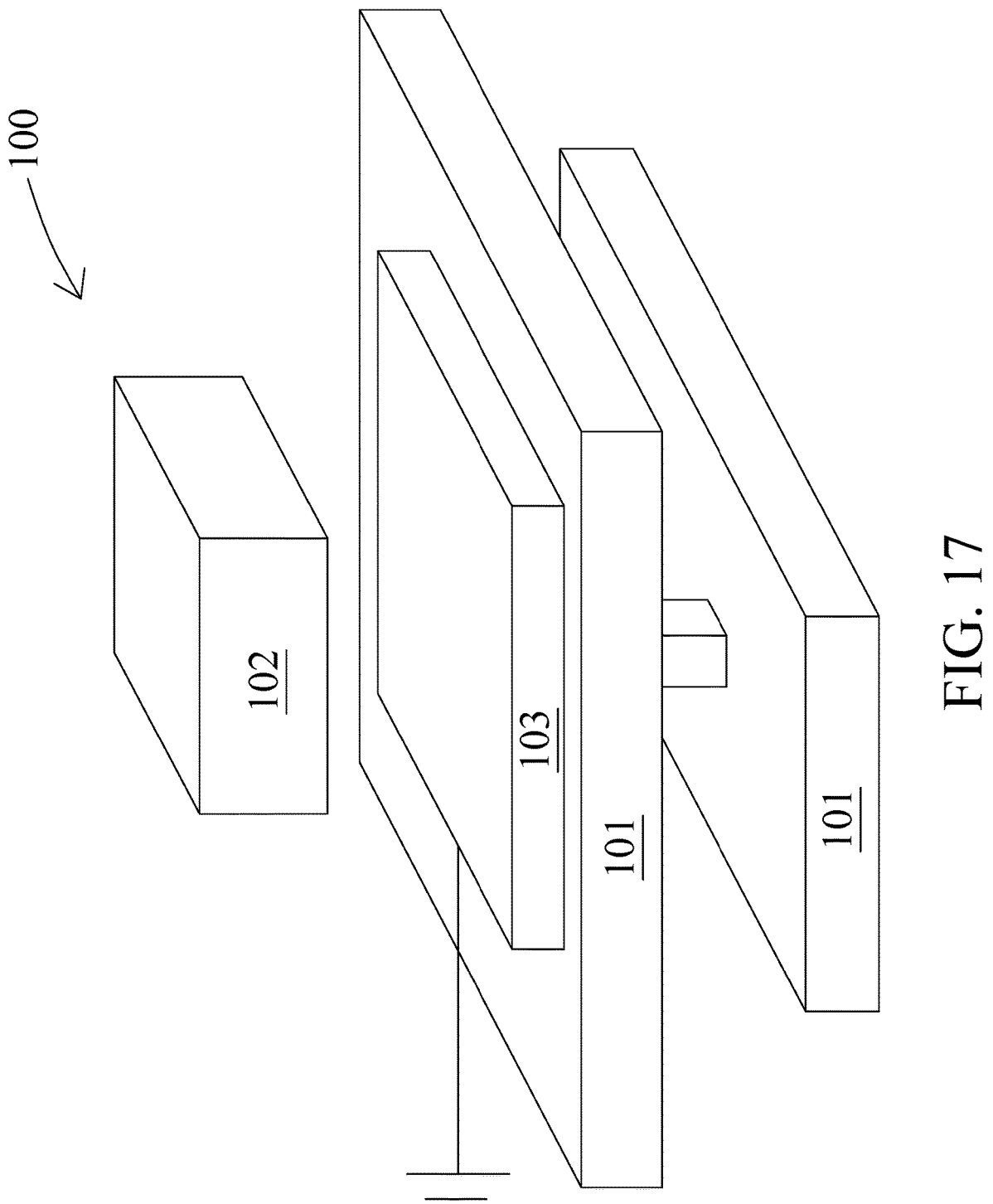

In operation 403, a voltage is applied to the semiconductor structure 103 as shown in FIG. 17. In some embodiments, the operation 403 is substantially the same as the operation 203 and 303.

Figure 18:
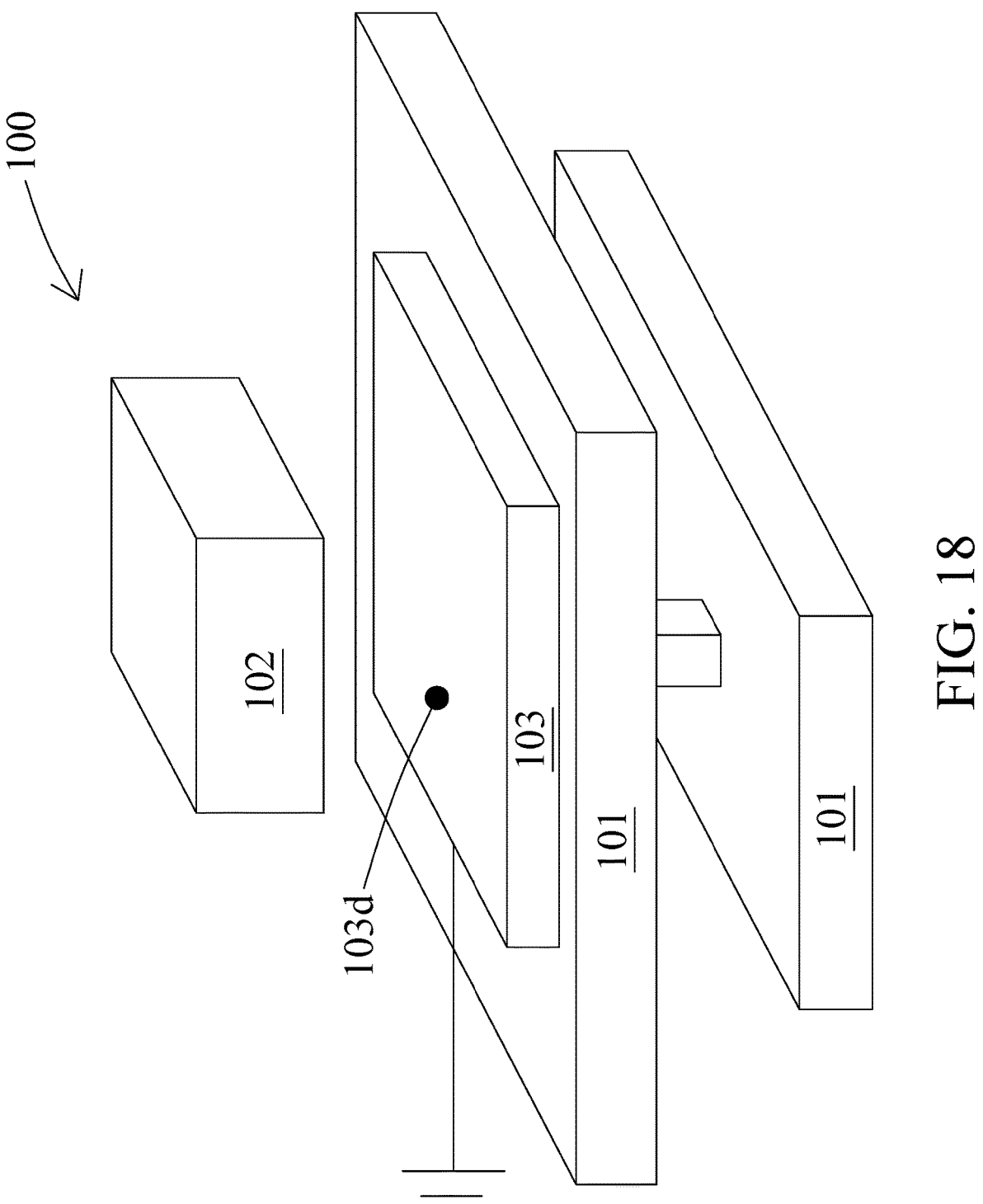

In operation 404, a portion 103*d* of the semiconductor structure 103 at a temperature substantially greater than a predetermined threshold is identified by the detector 102 as shown in FIG. 18. In some embodiments, the operation 404 is substantially the same as the operation 204 and 304.

Figure 19:
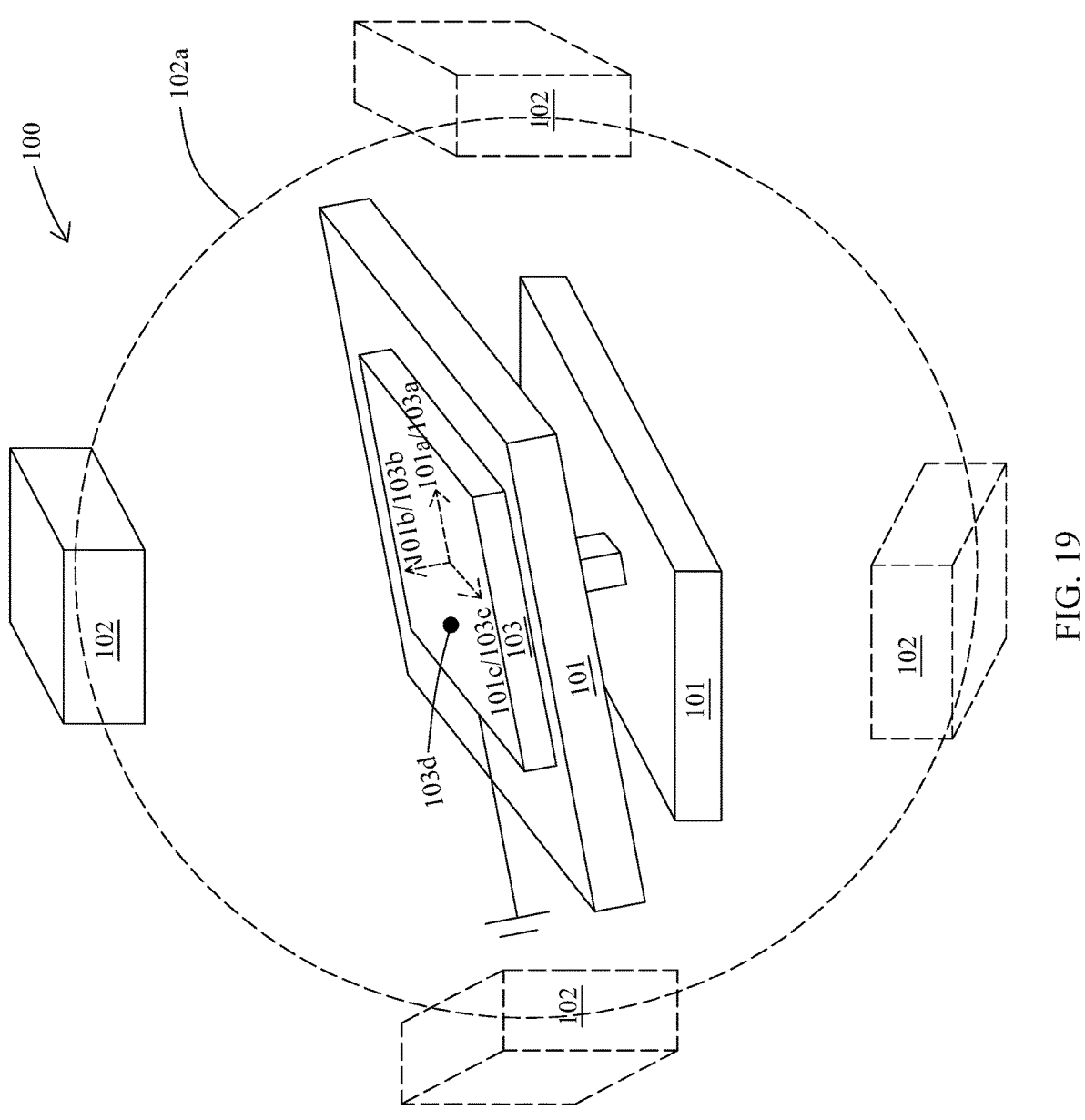

In operation 405, the stage 101 is rotated as shown in FIG. 19. In some embodiments, the stage 101 is rotated about the first axis 101*a*, the second axis 101*b* or the third axis 101*c*. In some embodiments, the portion 103*d* of the semiconductor structure 103 is detected by the detector 102 upon or after the rotation of the stage 101. In some embodiments, the operation 405 is substantially the same as the operation 205.

In operation 406, the rotation of the stage 101 is recorded. In some embodiments, the rotation of the stage 101 is recorded after the detection of the portion 103*d* of the semiconductor structure 103 by the detector 102. In some embodiments, the operation 406 is substantially the same as the operation 206.

In operation 407, the detector 102 is rotated about the stage 101 as shown in FIG. 19. In some embodiments, the detector 102 is rotated in a path 102*a* around the stage 101 and the semiconductor structure 103. In some embodiments, the portion 103*d* of the semiconductor structure 103 is detected by the detector 102 upon or after the rotation of the detector 102. In some embodiments, the operation 407 is substantially the same as the operation 305. In some embodiments, the rotation of the stage 101 and the rotation of the detector 102 are performed simultaneously.

In operation 408, the rotation of the detector 102 is recorded. In some embodiments, the rotation of the detector 102 is recorded after the detection of the portion 103*d* of the semiconductor structure 103 by the detector 102. In some embodiments, the operation 407 is substantially the same as the operation 306.

In operation 409, a position of the portion 103*d* of the semiconductor structure 103 is derived based upon the rotation of the stage 101 and the rotation of the detector 102. For example, the stage 101 is rotated about the first axis 101*a* and the third axis 101*c* and the detector 102 is rotated about the stage 101, then angles of the rotation of the stage 101 about the first axis 101*a* and the third axis 101*c* and angles of the rotation of the detector 102 about the stage 101 are recorded, and then the position of the portion 103*d* is calculated based on the record of the angles of the rotation of the stage 101 about the first axis 101*a* and the third axis 101*c* and the angles of the rotation of the detector 102 about the stage 101. In some embodiments, the position of the portion 103*d* of the semiconductor structure 103 is derived from the record of the rotation of the stage 101 and the record of the rotation of the detector 102. In some embodiments, the position of the portion 103*d* is a three dimensional position of the portion 103*d* of the semiconductor structure 103. Since IR radiation emitted from the portion 103*d* of the semiconductor structure 103 can be detected by the detector 102 in different directions after the rotation of the stage 101 and the rotation of the detector 102, the position of the portion 103*d* of the semiconductor structure 103 can be located accurately.

In the present disclosure, a method of analyzing a semiconductor structure is disclosed. The method includes providing a semiconductor structure, a stage and a detector, loading the semiconductor structure on the stage, applying a voltage to the semiconductor structure, identifying a portion of the semiconductor structure at a temperature substantially greater than a predetermined threshold by the detector, rotating the stage or rotating the detector, recording the rotation of the stage or the rotation of the detector, and deriving a position of the portion of the semiconductor structure based upon the rotation of the stage or the rotation of the detector. IR radiation emitted from an abnormal portion of the semiconductor structure can be detected by the detector in different directions. Therefore, a position of the abnormal portion can be located accurately.

In some embodiments, a method includes loading the semiconductor structure on a stage; providing a detector disposed above the semiconductor structure and the stage; applying a voltage to the semiconductor structure; identifying a portion of the semiconductor structure at a temperature substantially greater than a predetermined threshold by the detector; rotating the stage and recording a rotation of the stage after identifying the portion of the semiconductor structure; and deriving a position of the portion of the semiconductor structure based upon the rotation of the stage.

In some embodiments, the rotation of the stage includes rotating the stage about at least one of a first axis of the stage, a second axis of the stage substantially orthogonal to the first axis and a third axis of the stage substantially orthogonal to the first axis and the second axis. In some embodiments, the recording of the rotation of the stage includes recording a first rotation of the stage about the first axis in a first angle, recording a second rotation of the stage about the second axis in a second angle, or recording a third rotation of the stage about the third axis in a third angle. In some embodiments, the stage is rotated relative to the detector. In some embodiments, the detector is stationary.

In some embodiments, the method further includes detecting infrared (IR) radiation emitted from the semiconductor structure by the detector; recording a level of IR radiation emitted from the semiconductor structure. In some embodiments, the detector is linearly movable. In some embodiments, the method further includes recording a linear movement of the detector. In some embodiments, the semiconductor structure is attached to the stage upon the rotation of the stage. In some embodiments, the rotation of the stage is consistent with a rotation of the semiconductor structure. In some embodiments, the semiconductor structure includes a plurality of dies or a plurality of packages stacking over each other. In some embodiments, the portion of the semiconductor structure is disposed inside the semiconductor structure.

In some embodiments, a method includes loading the semiconductor structure on a stage; providing a detector; applying a voltage to the semiconductor structure; identifying a portion of the semiconductor structure at a temperature substantially greater than a predetermined threshold by the detector; rotating the detector and recording a rotation of the detector after identifying the portion of the semiconductor structure; and deriving a position of the portion of the semiconductor structure based upon the rotation of the detector.

In some embodiments, the detector is rotated about the stage. In some embodiments, the stage is stationary. In some embodiments, a distance between the stage and the detector is substantially constant upon the rotation of the detector. In some embodiments, the recording of the rotation of the detector includes recording an angle rotated by the detector about the stage.

In some embodiments, a method includes loading the semiconductor structure on a stage; providing a detector; applying a voltage to the semiconductor structure; identifying a portion of the semiconductor structure at a temperature substantially greater than a predetermined threshold by the detector; rotating the stage and recording a rotation of the stage after identifying the portion of the semiconductor structure; rotating the detector about the stage and recording a rotation of the detector after identifying the portion of the semiconductor structure; and deriving a position of the portion of the semiconductor structure based upon the rotation of the stage and the rotation of the detector.

In some embodiments, the semiconductor structure is attached to the stage upon the rotation of the stage and the rotation of the detector. In some embodiments, the rotation of the stage and the rotation of the detector are performed simultaneously.

In some embodiments, a method includes providing a detector disposed above a semiconductor structure; identifying a portion of the semiconductor structure at a temperature substantially greater than a predetermined threshold by the detector; rotating the stage; and deriving a position of the portion of the semiconductor structure based upon the rotation of the stage.

In some embodiments, the detector is stationary upon the rotation of the stage. In some embodiments, the semiconductor structure is rotated consistent with the rotation of the stage. In some embodiments, the identification of the portion of the semiconductor structure includes moving the detector over the semiconductor structure. In some embodiments, the semiconductor structure is stacked dies including a plurality of dies stacking over each other, and the portion of the semiconductor structure is covered by one of the plurality of dies. In some embodiments, the semiconductor structure is operated upon the identification of the portion of the semiconductor structure. In some embodiments, the method further includes applying a voltage to the semiconductor structure upon the identification of the portion of the semiconductor structure. In some embodiments, the method includes recording the rotation of the stage about an axis in an angle. In some embodiments, the semiconductor structure is attached on the stage. In some embodiments, the detector is a thermal detector.

In some embodiments, a method includes identifying a portion of a semiconductor structure at a temperature substantially greater than a predetermined threshold by a detector; rotating the detector about the semiconductor structure; and deriving a position of the portion of the semiconductor structure based upon the rotation of the detector.

In some embodiments, the semiconductor structure is stationary. In some embodiments, the detector is rotated along a circular or elliptical path. In some embodiments, the semiconductor structure is operated upon the rotation of the detector. In some embodiments, the semiconductor structure is disposed on a stage, and the stage is stationary upon the rotation of the detector.

In some embodiments, a method is disclosed. The method includes providing a detector, a stage and a semiconductor structure on the stage; identifying a portion of the semiconductor structure at a temperature substantially greater than a predetermined threshold by the detector; rotating the stage; rotating the detector about the stage; and deriving a position of the portion of the semiconductor structure based upon the rotation of the stage and the rotation of the detector.

In some embodiments, the stage, the semiconductor structure and the detector are rotated simultaneously. In some embodiments, the rotation of the stage includes rotating the stage about at least one of a first axis of the semiconductor structure, a second axis of the semiconductor structure substantially orthogonal to the first axis and a third axis of the semiconductor structure substantially orthogonal to the first axis and the second axis. In some embodiments, the detector is rotated about the stage and the semiconductor structure. In some embodiments, the method further includes detecting infrared (IR) radiation emitted from the semiconductor structure by the detector upon the rotation of the detector about the stage and the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   identifying a portion of a semiconductor structure at a temperature greater than a predetermined threshold by a detector;
   rotating the semiconductor structure and detecting the portion of the semiconductor structure in different directions; and
   deriving a three dimensional position of the portion of the semiconductor structure inside the semiconductor structure based upon the rotating the semiconductor structure,
   wherein the rotating the semiconductor structure comprises rotating the semiconductor structure about a first axis of the semiconductor structure and a second axis of the semiconductor structure orthogonal to the first axis.

2. The method of claim 1, wherein the detector is stationary during the rotating the semiconductor structure.

3. The method of claim 1, further comprising:
   recording the rotating the semiconductor structure after the identifying the portion of the semiconductor structure;
   recording the three dimensional position of the portion of the semiconductor structure.

4. The method of claim 1, wherein the semiconductor structure is stacked dies including a plurality of dies stacking over each other.

5. The method of claim 4, wherein the portion of the semiconductor structure is covered by one or more of the plurality of dies.

6. The method of claim 1, wherein the rotating the semiconductor structure further includes rotating the semiconductor structure about a third axis of the semiconductor structure orthogonal to the first axis and the second axis.

7. The method of claim 6, further comprising recording a first rotation of the semiconductor structure about the first axis in a first angle, recording a second rotation of the semiconductor structure about the second axis in a second angle, or recording a third rotation of the semiconductor structure about the third axis in a third angle.

8. The method of claim 1, wherein a circuitry of the semiconductor structure is operated during the identifying the portion of the semiconductor structure.

9. The method of claim 1, wherein the temperature at the portion of the semiconductor structure is greater than a temperature at another portion of the semiconductor structure away from the portion of the semiconductor structure.

10. The method of claim 1, wherein a circuitry of the semiconductor structure is operated during the rotating the semiconductor structure.

11. A method, comprising:
   applying a voltage to a semiconductor structure and identifying a portion of the semiconductor structure at a temperature greater than a predetermined threshold by a detector;
   rotating the detector around the semiconductor structure, wherein the detector detects the portion of the semiconductor structure in different directions; and
   deriving a three dimensional position of the portion of the semiconductor structure inside the semiconductor structure based upon the portion of the semiconductor structure detected by the detector in the different directions.

12. The method of claim 11, wherein the semiconductor structure is stationary during the rotating the detector.

13. The method of claim 11, wherein the voltage is applied to the semiconductor structure during the rotating the detector.

14. The method of claim 11, wherein the detector is disposed above or under the semiconductor structure.

15. The method of claim 11, wherein a distance between the semiconductor structure and the detector is constant during the rotating the detector.

16. The method of claim 11, wherein the detector is rotated around the semiconductor structure in a circular or elliptical path.

17. A method, comprising:
   providing a detector and a semiconductor structure;
   identifying a portion of the semiconductor structure at a temperature greater than a predetermined threshold by the detector;
   rotating the semiconductor structure;
   rotating the detector around the semiconductor structure in a circular or elliptical path and detecting the portion of the semiconductor structure in different directions; and
   deriving a three dimensional position of the portion of the semiconductor structure inside the semiconductor structure based upon the rotating the semiconductor structure and the rotating the detector.

18. The method of claim 17, wherein the semiconductor structure and the detector are rotated simultaneously.

19. The method of claim 17, further comprising detecting infrared (IR) radiation emitted from the semiconductor structure by the detector during the rotating the detector and the rotating the semiconductor structure.

20. The method of claim 17, wherein the semiconductor structure is rotated about an axis of the semiconductor structure.

* * * * *